US007116045B2

(12) United States Patent
Karasawa et al.

(10) Patent No.: US 7,116,045 B2
(45) Date of Patent: *Oct. 3, 2006

(54) DISPLAY PANEL, ELECTRONIC APPARATUS WITH THE SAME, AND METHOD OF MANUFACTURING THE SAME

(75) Inventors: Yasushi Karasawa, Shiojiri (JP); Shigeo Nojima, Suwa (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 104 days.

This patent is subject to a terminal disclaimer.

(21) Appl. No.: 10/737,899

(22) Filed: Dec. 18, 2003

(65) Prior Publication Data

US 2004/0178725 A1 Sep. 16, 2004

(30) Foreign Application Priority Data

| Oct. 3, 2002 | (JP) | 2002-291164 |
| Dec. 27, 2002 | (JP) | 2002-378850 |
| Dec. 27, 2002 | (JP) | 2002-378852 |
| Jul. 14, 2003 | (JP) | 2003-196236 |

(51) Int. Cl.
H01J 1/64 (2006.01)
H01J 1/68 (2006.01)
H01J 1/70 (2006.01)
H01J 5/16 (2006.01)

(52) U.S. Cl. ............ 313/501; 313/512; 313/112; 313/110

(58) Field of Classification Search ............ 313/506, 313/501, 512
See application file for complete search history.

(56) References Cited

U.S. PATENT DOCUMENTS

| 5,986,401 A * | 11/1999 | Thompson et al. ......... 313/504 |
| 6,188,176 B1 * | 2/2001 | Nakaya et al. ............ 313/504 |
| 6,251,531 B1 * | 6/2001 | Enokida et al. ............ 428/690 |
| 6,252,246 B1 * | 6/2001 | Arai et al. ................ 257/40 |
| 6,515,310 B1 * | 2/2003 | Yamazaki et al. ........... 257/98 |
| 6,521,359 B1 * | 2/2003 | Noguchi et al. ............ 428/690 |
| 2002/0038998 A1 * | 4/2002 | Fujita et al. ............. 313/495 |
| 2002/0153831 A1 * | 10/2002 | Sakakura et al. .......... 313/504 |
| 2002/0158573 A1 * | 10/2002 | Kobashi .................. 313/498 |
| 2002/0175619 A1 * | 11/2002 | Kita et al. ............... 313/504 |
| 2002/0180350 A1 * | 12/2002 | Furugori et al. ........... 313/506 |
| 2002/0195928 A1 * | 12/2002 | Grace et al. .............. 313/503 |
| 2003/0071563 A1 * | 4/2003 | Hamada et al. ............ 313/500 |
| 2003/0100630 A1 * | 5/2003 | Yamaguchi et al. ........ 523/200 |
| 2003/0117071 A1 * | 6/2003 | Lee et al. ................ 313/512 |
| 2003/0122482 A1 * | 7/2003 | Yamanaka et al. ......... 313/512 |
| 2004/0178724 A1 * | 9/2004 | Karasawa et al. ......... 313/506 |

FOREIGN PATENT DOCUMENTS

| JP | A-8-321381 | 12/1996 |
| JP | B2-2901370 | 3/1999 |
| JP | B2-2931229 | 5/1999 |
| JP | A-2001-230072 | 8/2001 |
| JP | A-2003-17274 | 1/2003 |

* cited by examiner

Primary Examiner—Mariceli Santiago
Assistant Examiner—Elizabeth Rielley
(74) Attorney, Agent, or Firm—Oliff & Berridge, PLC

(57) ABSTRACT

A display panel is provided that is capable of enhancing visibility outdoors and which can be easily manufactured. In a display panel in which at least one side thereof serves as a display surface, the display panel includes a first reflectance layer, which may be made of titanium, titanium nitride, or an alloy of titanium and tungsten and a second reflectance layer, which may be made of indium tin oxide, indium zinc oxide, or gallium zinc oxide, the first and second low reflection layer being deposited at positions corresponding to pixels on a substrate.

11 Claims, 10 Drawing Sheets

1: SUBSTRATE
2: ELECTRODE
3: FIRST LOW REFLECTION LAYER
4: SECOND LOW REFLECTION LAYER
5A: HOLE INJECTING AND TRANSPORTING LAYER
5B: LIGHT-EMITTING LAYER
6: CONDUCTIVE FILM
7: BANK
8: SEALING FILM
31: GATE ELECTRODE
37: GATE INSULATING FILM
51: INTERLAYER INSULATING FILM
52: PLANARIZING INSULATING FILM
61: INSULATING PASSIVATION FILM

- 1: SUBSTRATE
- 2: ELECTRODE
- 3: FIRST LOW REFLECTION LAYER
- 4: SECOND LOW REFLECTION LAYER
- 5A: HOLE INJECTING AND TRANSPORTING LAYER
- 5B: LIGHT-EMITTING LAYER
- 6: CONDUCTIVE FILM
- 7: BANK
- 8: SEALING FILM
- 31: GATE ELECTRODE
- 37: GATE INSULATING FILM
- 51: INTERLAYER INSULATING FILM
- 52: PLANARIZING INSULATING FILM
- 61: INSULATING PASSIVATION FILM

2: ELECTRODE

3: FIRST LOW REFLECTION LAYER

20: FIRST TFT

21: GATE ELECTRODE

22: DRAIN ELECTRODE

30: SECOND TFT

31: GATE ELECTRODE

36: EXTENDED PORTION OF GATE ELECTRODE 31

39: EXTENDED PORTION OF COMMON ELECTRODE com

| FILM THICKNESS OF Ti (nm) | SPUTTERING PRESSURE (Pa) |
|---|---|
| 200 | 0.6 |
| 200 | 0.4 |
| 200 | 0.23 |
| 400 | 0.4 |

SPUTTERING PRESSURE (Pa)
♦ 0.23
■ 0.4
▲ 0.6

———— Ti/ITO 116 nm

──── Ti/ITO 78 nm (RT)

Ti/ITO(RT)

Ti/ITO 280°C

Ti

Al/ITO/Al

DISPLAY PANEL, ELECTRONIC APPARATUS WITH THE SAME, AND METHOD OF MANUFACTURING THE SAME

BACKGROUND OF THE INVENTION

1. Field of Invention

The present invention relates to a display panel and the like. More particularly, the present invention is directed to enhance low visibility due to the reflection of light incident from the exterior.

2. Description of Related Art

Recently, display devices utilizing a liquid crystal display (LCD), an organic electroluminescent element (hereinafter, "an organic EL element"), and the like are employed in various electronics, such as a cellular phone, a personal computer, an electronic organizer, a portable electronic game console, and the like. As such, users have many opportunities to look at a display screen of the electronic apparatus outdoors as well as looking at the screen indoors.

A related art apparatus, in which light is incident on the display screen from the exterior will now be discussed. The incident light is reflected from the screen back to viewers. However, more intense light is incident on the screen and is reflected from the screen back to the viewers not indoors, but outdoors. As such, the contrast of the display device is reduced, thereby reducing the quality of the display image.

A related art case in which an organic EL element is employed will now be considered. Since the organic EL elements, which are self-luminescent elements, have high visibility and response speed, the display devices employing the organic EL elements are suitable to display moving pictures. However, existing organic EL elements do not simultaneously realize high luminance and a long lifespan. As such, it is impossible to avoid a reduction in visibility due to the effect of light incident from the exterior out of doors. Therefore, in order to enhance contrast, a related art display device has been disclosed in which an antireflection film, composed of a laminated film of $TiO_2$ and $SiO_2$, is formed on the inner and outer surfaces of a cover to seal the display device. See Japanese Unexamined Patent Application Publication No. 2001-230072.

Further, another related art display device has been disclosed in which a circular polarizing plate is formed above a surface of the cover to suppress the reflection of light incident from the exterior See Japanese Unexamined Patent Application Publication No. 8-321381. In addition, a related art structure has been disclosed in which $TaO_x$ (tantalum oxide) deposited under a reactive atmosphere or by CVD is used as an absorption layer in order to enhance contrast. See Japanese Patent No. 2901370. Furthermore, an organic EL element, in which a charge injecting layer having light absorption and diffusion properties (see Japanese Patent No. 2931229) is provided, a display panel with a black absorbent formed on the bottom thereof (see U.S. Pat. No. 5,986,401, and an organic EL element, in which a black multi-layered film is used for an electrode (see Japanese Unexamined Patent Application Publication No. 2003-17274) have been disclosed in the related art.

In these related art display devices, since an expensive member, such as a circular polarizing plate, must be provided for a display device, more expense and effort are required, thereby increasing costs. In addition, since a filter, such as a circular polarizing plate, is provided, even though the organic EL element emits light, the light is not emitted externally, thereby lowering actual brightness and thus reducing visibility.

A related art display device has been disclosed in which a triple-layered film of a reflective aluminum film, a silicon oxide/aluminum film, and an aluminum transflective film is used to suppress reflectance. However, in this case, it is not easy to manufacture the display device due to its complicated structure. Further, when the triple-layered film is used as an anode, a separate conductive film having a high work function has to be deposited.

SUMMARY OF THE INVENTION

The present invention is designed to address the aforementioned problems. The present invention provides a display panel capable of being easily manufactured and enhancing visibility outdoors as well.

A display panel according to an aspect of the present invention includes: a first low reflection layer made of titanium and deposited on a electrode; a second low reflection layer made of indium tin oxide and deposited on the first low reflection layer; and light-emitting elements deposited on the second low reflection layer.

According to an aspect of the present invention, the display panel includes the first low reflection layer of titanium and the second low reflection layer of indium tin oxide formed on the substrate, thereby considerably reducing the reflection of light incident from the exterior by the interaction of the respective layers including the light-emitting elements and their interfaces. As such, visibility can be enhanced outdoors. Further, a basic structure to reduce reflection may be constructed by two layers, so that the display panel is easily manufactured.

In addition, a display panel according to an aspect of the present invention includes: a substrate provided with control elements to control the supply of electric charge to pixels; a first low reflection layer made of titanium and deposited at positions corresponding to the pixels on the substrate; a second low reflection layer made of indium tin oxide and deposited on the first low reflection layer; and light-emitting elements, functioning as the pixels, deposited on the second low reflection layer and emitting light based on the supplied electric charge.

According to an aspect of the present invention, the display panel includes the first low reflection layer of titanium and the second low reflection layer of indium tin oxide formed on the substrate provided with control elements, such as TFTs, thereby considerably reducing the reflection of light incident from the exterior by the interaction between the respective layers including the light-emitting elements and their interfaces. Accordingly, a degree of freedom relating to the arrangement of the control elements and wiring lines on the substrate can increase on the side of the substrate rather than on the first low reflection layer having a low contribution to the reflection.

According to an aspect of the present invention, there is provided a display panel including: a substrate provided with control elements to control the supply of electric charge to pixels for display control; a first low reflection layer of titanium deposited at positions corresponding to the pixels on the substrate; a second low reflection layer of indium tin oxide deposited on the first low reflection layer; light-emitting elements deposited on the second low reflection layer and emitting light based on the electric charge supplied under the control of the control elements; a conductive film deposited on the light-emitting elements and supplying to the light-emitting elements electric charge having a polarity opposite to the electric charge supplied from the second low reflection layer; and a sealing member provided on the conductive film as a display surface and facing the substrate.

According to an aspect of the present invention, in the display panel, the first low reflection layer made of titanium, the second low reflection layer made of indium tin oxide, the light-emitting elements, and the conductive film are deposited on the substrate provided with the control elements, such as TFTs, and then the sealing member is provided thereon. Accordingly, since indium tin oxide is also deposited on the bonding portions between the substrate and the sealing member when the second low reflection layer is deposited, the adhesion between the substrate and the sealing member can be enhanced due to the roughness effect of indium tin oxide in the case of using the adhesive. Therefore, it is possible to securely reduce or prevent the permeation of moisture and oxygen into the display panel.

Furthermore, in the display panel according to an aspect of the present invention, the second low reflection layer is deposited with a thickness of 60 nm to 100 nm.

According to an aspect of the present invention, in a case where the second low reflection layer has a thickness of 60 nm, the minimum reflectance of light is obtained in the vicinity of a wavelength of 70 nm. Further, in a case where the second low reflection layer has a thickness of 100 nm, the minimum reflectance of light is obtained in the vicinity of a wavelength of 100 nm. In the outdoors, in a case where the second low reflection layer has a thickness of 60 nm to 70 nm, good visibility can be obtained.

In the display panel according to an aspect of the present invention, the second low reflection layer is made of indium zinc oxide, gallium zinc oxide, or indium cerium oxide instead of indium tin oxide.

According to an aspect of the present invention, the second low reflection layer is made of indium zinc oxide, or gallium zinc oxide, which is a conductive material similarly to the indium tin oxide. Contrary to ITO, even though these materials are deposited in an atmosphere containing no oxygen, they can have high conductivity. Therefore, dependency upon an oxygen concentration in the deposition is small, and high reproducibility can be obtained in its manufacture. Also, since the materials have a high stability, the deterioration thereof is small as time passed. In addition, since indium cerium oxide has a work function suitable to inject electric charge into a light-emitting material, high injection efficiency of electric charge can be obtained. Further, since indium zinc oxide has a work function suitable to inject electric charge into a light-emitting material, high injection efficiency of electric charge can be obtained. Furthermore, since the internal stress of the film is low, the adhesion between the substrate, the light emitting layer, the electric charge injecting layer, and the electric charge transporting layer is high. Thus the lifespan of the light-emitting device can be lengthened.

In addition, in the display panel according to an aspect of the present invention, the conductive film is made of indium cerium oxide. Even though indium cerium oxide is deposited in an atmosphere containing no oxygen, it can have high conductivity. Therefore, the influence thereof on the light-emitting layer, the electric charge injecting layer, and the electric charge transporting layer at the time of deposition can be suppressed, thereby prolonging the lifespan of the light-emitting elements.

Furthermore, in the display panel according to an aspect of the present invention, the second low reflection layer is deposited such that the arithmetic mean roughness Ra of surface thereof measured by a stylus-type step-difference measuring apparatus is in the range of 4 nm to 11 nm.

According to an aspect of the present invention, the surface of the second low reflection layer is crystallized, and the second low reflection layer is deposited such that the arithmetic mean roughness Ra of surface thereof is in the range of 4 nm to 11 nm. As a result, the surface is not made smooth. Since the surface of the second low reflection layer is not smooth, reflectance can be reduced. The reason is that the thickness of the second low reflection layer is locally not uniform and the interaction among the first low reflection layer, the respective layers including the light-emitting element, and their layers is achieved with respect to the light of various wavelengths. In this case, if the surface is too rough, a short circuit occurs, and if the surface is too smooth, a sufficient effect is not obtained. Therefore, Ra including the substrate is preferably within the range of 10 nm to 100 nm.

In the display panel according to an aspect of the present invention, the first low reflection layer is made of titanium nitride instead of titanium.

According to an aspect of the present invention, since titanium nitride having a high absorbing effect in a visible ray is used, the reflectance of light incident from the exterior can be reduced.

Further, in the display panel according to an aspect of the present invention, the first low reflection layer is made of an alloy of titanium and tungsten instead of titanium.

According to an aspect of the present invention, since the alloy of titanium and tungsten having a high absorbing effect in a visible ray is used, the reflectance of light incident from the exterior can be reduced.

Furthermore, in the display panel according to an aspect of the present invention, a titanium oxide layer is provided between the first and second low reflection layers.

According to an aspect of the present invention, a titanium oxide layer absorbing light of a predetermined wavelength is provided between the first and second low reflection layers. Accordingly, the reflectance with respect to light of a predetermined wavelength can be reduced.

Moreover, in the display panel according to an aspect of the present invention, the first low reflection layer is deposited with a thickness of 30 nm to 400 nm.

According to an aspect of the present invention, if the thickness of the first low reflection layer is 30 nm or less, reflectance is high. If the thickness is 400 nm or more, an internal stress is easily produced, and there are possibilities that the substrate bends, the film peels off, or the elements are broken down. Further, it is difficult to manufacture the substrate.

In addition, in the display panel according to an aspect of the present invention, the thickness of ITO to form the second low reflection layer is within the range of 62 nm to 82 nm, the thickness of ITO to form the conductive film is within the range of 135 nm to 155 nm, a light-emitting polymer to form the light-emitting layer constituting the light-emitting element is deposited with a thickness of 70 nm to 90 nm, or 150 nm to 170 nm, and the hole injecting and transporting layer is deposited with a thickness of 80 nm to 100 nm, or 170 nm to 190 nm.

According to an aspect of the present invention, reflectance can be reduced without degrading the light-emitting characteristic of the light-emitting element. Therefore, in a case where light is incident from the exterior, contrast can increase, and visibility can be enhanced.

Further, in the display panel according to an aspect of the present invention, a planarizing film is provided between the substrate and the first low reflection layer.

According to an aspect of the present invention, by providing the planarizing film, the influence of the step difference, due to the driving device and wiring lines, can be reduced, and the reproducibility of characteristic at the time of depositing the first and second low reflection layers can be enhanced. Further, a pattern can be easily formed. In addition, since the step difference on the substrate is reduced, a sealing performance is enhanced, thereby reducing the characteristic discordance between the pixels due to a short circuit, etc.

Furthermore, in the display panel according to an aspect of the present invention, a chromium layer is further deposited on the second low reflection layer.

According to an aspect of the present invention, the chromium layer is further deposited on the second low reflection layer, and the low reflection layer also functions as a hole injecting layer to enhance the injection efficiency of hole.

Moreover, in the display panel according to an aspect of the present invention, in a step of forming the control elements and the wiring lines and a step of forming the first low reflection layer or the second low reflection layer, some of or all of the steps are commonly used.

According to an aspect of the present invention, the formation of other circuits, including the control elements and the deposition of the first or second low reflection layer, may be performed with the same material by a series of process or a mixed process, and the equipment may be shared. As such, it is possible to effectively manufacture the panel and to cope with the miniaturization and high integration of element. Further, even if a display panel with a high function and high precision is manufactured, an increase in cost can be suppressed.

In addition, the display panel according to an aspect of the present invention includes a black layer having a function of reducing a step difference at a lower portion and light-emitting elements provided on the black layer.

According to an aspect of the present invention, the black layer is deposited on the substrate by, for example, a spin coating method. Light incident from the exterior is absorbed by the black layer to suppress the reflection of light and thus to reduce reflectance. Further, since the black layer is deposited by the spin coating method, the influence of a step difference due to the control elements at the lower portion, wiring lines, etc., can be reduced. As such, even if an organic electroluminescent device is formed of the black layer, as in an organic EL display panel, it is possible to enhance the uniformity of the thickness of the light-emitting layer, thereby enhancing the uniformity in the light-emitting surface.

Furthermore, the display panel according to an aspect of the present invention includes a conductive black layer formed on a substrate and light-emitting elements provided on the black layer and emitting light on the basis of the supplied electric charge.

According to an aspect of the present invention, the conductive black layer, made of a material in which a black pigment is added to a conductive resin or a material in which carbon black is dispersed in the conductive resin, is deposited at positions corresponding to the pixels. Accordingly, the black layer absorbs light incident from the exterior and also serves as an electrode to supply lectric charge. Therefore, it is not necessary to form the electrode again.

Moreover, in the display panel according to an aspect of the present invention, the black layer is made of an allotrope of carbon.

According to an aspect of the present invention, the black layer is made of an allotrope of carbon, such as graphite, diamond like carbon, amorphous carbon, etc. Accordingly, the black layer absorbs light incident from the exterior and also serves as an electrode to supply electric charge. Therefore, it is not necessary to form the electrode again. Further, since the black layer has high conductivity, the deterioration of the light-emitting characteristics of the light-emitting element can be suppressed.

In addition, in the display panel according to an aspect of the present invention, control elements to control the supply of electric charge to the light-emitting element are formed on the substrate, and Peltier elements are formed at portions other than a display portion on the substrate.

According to an aspect of the present invention, in order to radiate the heat generated by the absorbed light out of the panel, the Peltier elements and the control elements are formed through a common process. A polycrystal, crystallite or amorphous silicon layer, which is an active region of the control element, may be used as a part of the Peltier element. Accordingly, for example, in the case of the display device using an organic EL element, by preventing an increase in temperature of the organic EL element, it is possible to lengthen the lifespan of the light-emitting element. In addition, the Peltier elements are integrally formed on the substrate, and a reduction in cost and the miniaturization thereof can be achieved.

Furthermore, an electronic apparatus according to an aspect of the present invention includes a display panel, as described above, to perform display.

According to an aspect of the present invention, the display panel of an aspect of the present invention is used for display portions of electronic apparatus, such as a cellular phone and a digital camera. As such, the visibility of the electronic apparatuses can be enhanced by suppressing the reflection of light incident from the exterior. Accordingly, when the electronic apparatuses are used outdoors, an enhanced effect can be obtained.

Moreover, according to an aspect of the present invention, there is provided a method of manufacturing a display panel having a plurality of pixels, the method including: forming a first low reflection layer of titanium at positions corresponding to pixels on a substrate; and forming a second low reflection layer of indium tin oxide on the first low reflection layer.

According to an aspect of the present invention, by depositing the first low reflection layer of titanium and the second low reflection layer of indium tin oxide on the electrode and by the interaction between the respective layers including the light-emitting elements and their interfaces, it is possible to considerably reduce the reflection of light incident from the exterior. Accordingly, visibility can be enhanced even if the display panel is used outdoors. Further, since a basic structure to reduce reflection is constructed by only two layers, it is possible to easily manufacture the display device.

In the method of manufacturing the display panel according to an aspect of the present invention, the first low reflection layer and the second low reflection layer are patterned so as to remain only at the positions corresponding to the pixels after the first and second low reflection layer are deposited by either a sputtering method or a deposition method.

According to an aspect of the present invention, after the first low reflection layer or the second low reflection layer is deposited by the sputtering method or the deposition method and is formed in a predetermined pattern by the resist, the layer is etched by a wet etching or a dry etching to form the first and second low reflection layers at the positions corresponding to the respective pixels. With such a manufacturing method, the pattern can be formed with high precision, and a display panel with high performance and high precision can be easily achieved.

Further, in the method of manufacturing the display panel according to an aspect of the present invention, the first low reflection layer and the second low reflection layer are deposited by either a sputtering method or a deposition method so as to remain only at the positions corresponding to the pixels after masking is previously performed at the positions corresponding to the pixels.

According to an aspect of the present invention, in a state where a mask having openings, formed at positions where the first and second low reflection layers are deposited, adheres closely to the substrate, the first and second low reflection layers are formed at the desired positions by a sputtering method or a deposition method. In this manner, an etching process is not required, and the layers can be formed without damaging a base layer, the control elements, the wiring lines, and the like.

Moreover, in the method of manufacturing the display panel according to an aspect of the present invention, the method may include: forming light-emitting elements at the positions corresponding to the pixels after forming the second low reflection layer; forming, on the light-emitting elements, a conductive film to supply to the light-emitting elements electric charge having a polarity opposite to the electric charge supplied from the second low reflection layer; and performing sealing using a transparent member to be a display surface.

According to an aspect of the present invention, the light-emitting elements, such as organic EL elements, the conductive film, and the sealing member are formed on the first low reflection layer. Accordingly, since indium tin oxide, which is to be the second low reflection layer, is deposited at bonding portions between the substrate and the sealing member at the time of depositing the second low reflection layer, adhesion between the substrate and the sealing member can be increased by the roughness effect of the indium tin oxide, and thus it is possible to securely reduce or prevent the permeation of moisture and oxygen.

According to an aspect of the present invention, there is provided a method of manufacturing a display panel, the method including: forming control elements to carry out display control on pixels on a surface opposite to a display surface of a substrate; applying a photosensitive resin containing a black pigment on the control-element-forming surface of the substrate to form a black layer; and forming through-holes or grooves to supply electric charge at positions corresponding to the pixels using the black layer.

According to an aspect of the present invention, the control elements are formed on silicon deposited on the substrate, the photosensitive resin containing the black pigment is applied on the control-element-forming surface of the substrate by, for example, a spin coating method to form a black layer, and the through-holes or grooves are formed on the black layer based on the positions of the pixels. Accordingly, light incident from the exterior is absorbed by the black layer to suppress the reflection of light and thus to reduce reflectance. Further, since the black layer is deposited by the spin coating method, the influence of a step difference due to the control elements at a lower portion, the wiring lines, and the like can be reduced. Therefore, even if organic light-emitting elements are formed of the black layer as in an organic EL display panel, the uniformity of the layer thickness of the light-emitting layer can be enhanced, and thus light can be uniformly emitted. Further, an electrode to control the supply of electric charge using the control element is directly connected to the light-emitting element through the through-hole or groove.

A method of manufacturing a display panel according to an aspect of the present invention includes: forming control elements to carry out display control on pixels on a surface opposite to a display surface of a substrate; and forming a conductive black layer at positions corresponding to the pixels on the control-element-forming surface of the substrate.

According to an aspect of the present invention, the conductive black layer made of, for example a material in which a black pigment is added into a conductive resin or a material in which carbon black is dispersed in the conductive resin is deposited at the positions corresponding to the pixels. Accordingly, the black layer absorbs light incident from the exterior and also serves as an electrode to supply electric charge. Therefore, it is not necessary to form the electrode again.

In the method of manufacturing the display panel according to an aspect of the present invention, since active regions of the control elements are made of silicon, Peltier elements are also formed at portions other than a display portion on the substrate when the control elements are formed.

According to an aspect of the present invention, in order to radiate the heat generated by the absorbed light out of the panel, the Peltier elements and the control elements are formed through a common process. A polycrystal, crystallite or amorphous silicon layer, which is an active region of the control element, may be used as a part of the Peltier element. Accordingly, in the case of the display device using, for example, an organic EL element, an increase in temperature of the organic EL element is reduced or prevented, and thus the lifespan of the organic EL element can be lengthened.

In the method of manufacturing the display panel according to an aspect of the present invention, in the step of forming the black layer, the black layer is formed of graphite deposited by a vacuum deposition method or a sputtering method.

According to an aspect of the present invention, the black layer of graphite is deposited by the vacuum deposition method or the sputtering method. Accordingly, the black layer absorbs light incident from the exterior and also functions as an electrode to supply electric charge. Therefore, it is not necessary to form the electrode again. Further, since the black layer has high conductivity, the deterioration of the light-emitting characteristic of the light-emitting element can be suppressed.

Furthermore, in the method of manufacturing the display panel according to an aspect of the present invention, in the step of forming the black layer, the black layer is formed of diamond like carbon deposited by a chemical vapor deposition method.

According to an aspect of the present invention, the black layer of diamond like carbon is deposited by the chemical vapor deposition method. Accordingly, the black layer absorbs light incident from the exterior and also functions as an electrode to supply electric charge. Therefore, it is not necessary to form the electrode again. Further, since the black layer has high conductivity, the deterioration of the light-emitting characteristic of the light-emitting element can be suppressed. Diamond like carbon is hard so that a scar is hardly formed on diamond like carbon during handling. Thus, the reliability is enhanced, and the yield increases.

In addition, the method of manufacturing the display panel according to an aspect of the present invention may include: forming light-emitting elements at the positions corresponding to the pixels after forming the black layer;

forming, on the light-emitting elements, a conductive film to supply to the light-emitting elements electric charge having a polarity opposite to the electric charge supplied from the black layer; and performing sealing using a sealing member.

According to an aspect of the present invention, the light-emitting elements, such as organic EL elements, the conductive film, and the sealing member are formed on the black layer. Accordingly, since the sealing member adheres to the substrate with good adhesion by a concave-convex surface of the black layer, the reliability is enhanced, and the reflection is effectively suppressed. Further, the visibility of the display panel can be enhanced outdoors.

Further, in the method of manufacturing the display panel according to an aspect of the present invention, in the step of forming the light-emitting elements, after banks are formed to store a solution of a polymer compound to form the light-emitting elements in regions where the pixels are formed, the solution is discharged at positions where the pixels are formed by a liquid drop discharging method.

According to an aspect of the present invention, when the liquid drop discharging method (ink jet method) is used to form the light-emitting elements, the partition is formed to store a solution in regions where the pixels are formed. Then a solution of a polymer compound to form the light-emitting elements is discharged and deposited, thereby forming the light-emitting elements. Accordingly, the light-emitting elements can be easily manufactured by the liquid drop discharging method without wasting the light-emitting-element material. These banks are also effectively used to form the light-emitting elements using, for example, a vacuum deposition method.

DETAILED DESCRIPTION OF EXEMPLARY EMBODIMENTS

First Exemplary Embodiment

Figure 1:
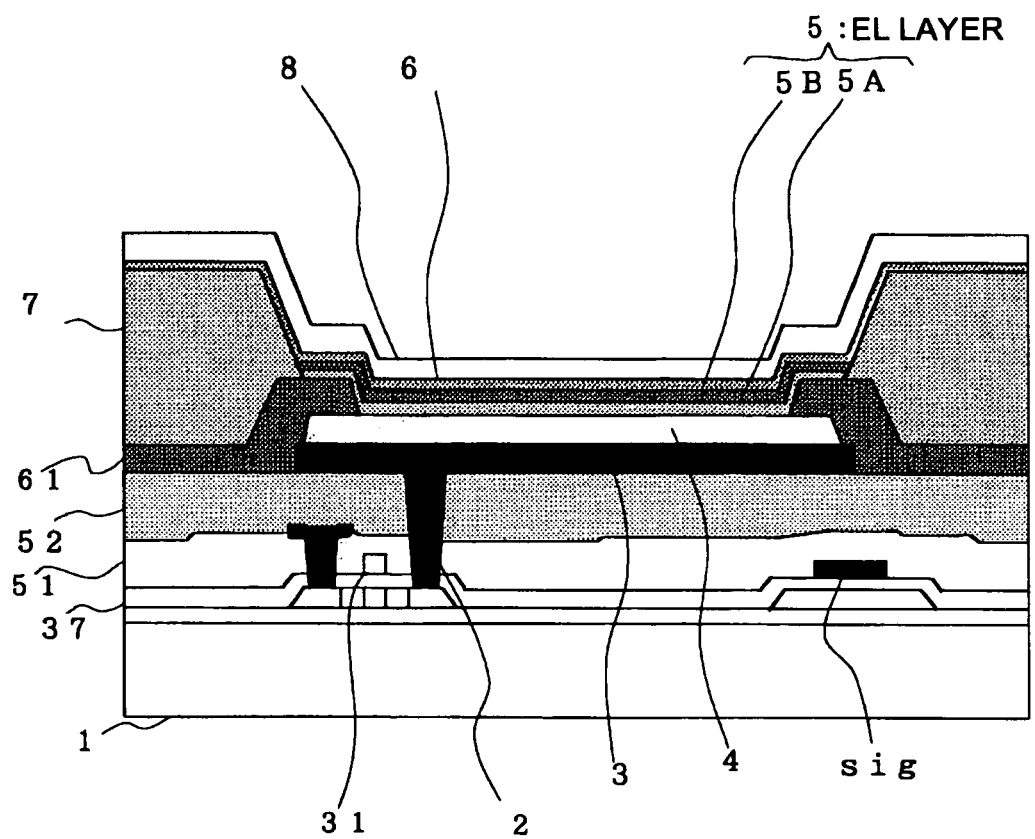
FIG. 1 is a cross-sectional view of a part of a display panel according to a first exemplary embodiment.

FIG. 1 is a cross-sectional view showing a part of the display panel according to a first exemplary embodiment of the present invention. In FIG. 1, reference numeral 1 indicates a substrate. In this exemplary embodiment, the substrate 1 is provided with thin film transistors (hereinafter, "TFTs" serving as control elements (driving elements)(only a second TFT 30 to be described later is shown in FIG. 1).

Figure 2:
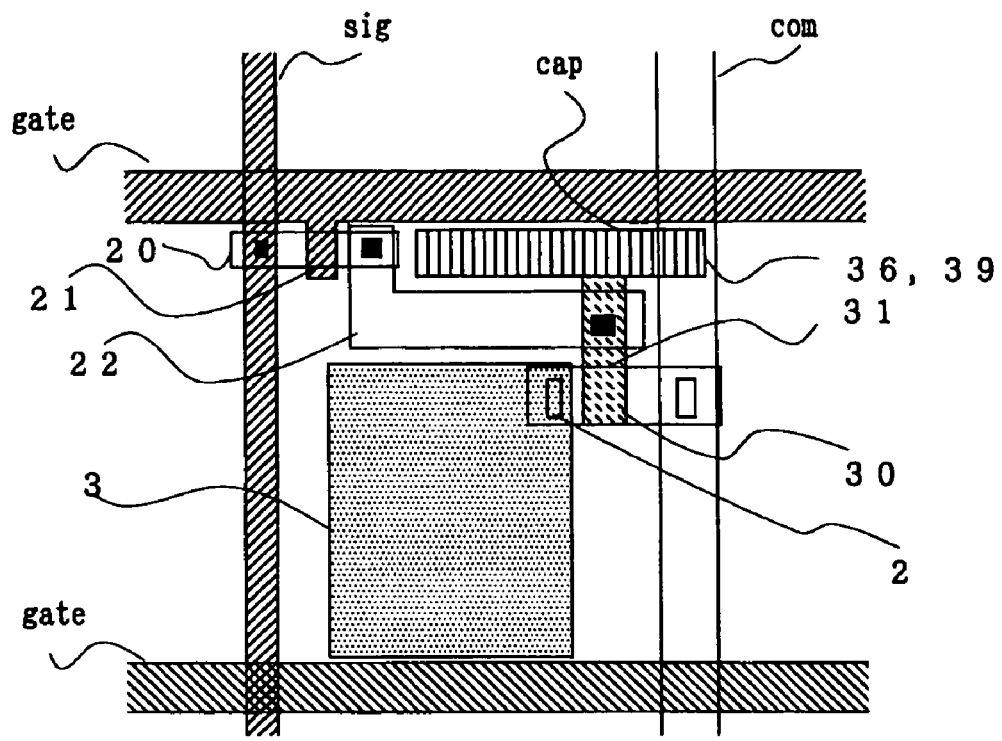
FIG. 2 is a plane view showing one pixel constituting the display panel.

FIG. 2 is a plane view showing one pixel constituting a display panel. FIG. 2 shows elements formed mostly between a second low reflection layer 4 (first low reflection layer 3) and the substrate. A gate electrode of a first TFT 20 is supplied with scanning signals via a scanning line "gate." A storage capacitor "cap" is adapted to hold image signals supplied from a data line "sig" via the first TFT 20. A gate electrode 31 of a second TFT 30 is supplied with the image signal held by the storage capacitor "cap."

The first TFT 20 and the second TFT 30 are formed of an isolated semiconductor film. A gate electrode 21 of the first TFT 20 is constructed as a part of the scan line "gate" and is supplied with the scan signal. One side of the source and drain regions of the first TFT 20 is electrically connected to the data line "sig" via a through-hole in an interlayer insulating film 51, and the other side of the source and drain regions is electrically connected to a drain electrode 22. The drain electrode 22 is electrically connected to the gate electrode 31 of the second TFT 30 via the through-hole of the interlayer insulating film 51. One side of the source and drain regions of the second TFT 30 is electrically connected to an electrode 2 simultaneously formed with the data line "sig" via the through-hole in the interlayer insulating film 51. The electrode 2 is electrically connected to the first low reflection layer 3, the second low reflection layer 4, and an EL layer 5 via the through-hole in a further planarizing insulating film 52.

The other side of the source and drain regions of the second TFT 30 is electrically connected to a common feeding line "com" via the through-hole in the interlayer insulating film 51. An extended portion 39 of the common feeding line "com" is opposite to an extended portion 36 of the gate electrode 31 of the second TFT 30 with the interlayer insulating film 51 formed therebetween, as a dielectric film, and thus forms the storage capacitor "cap." Further, instead of the above structure in which the storage capacitor "cap" is formed between the common feeding lines "com," the storage capacitor may be formed between the scanning line "gate" and a capacitive line formed parallel to the scanning line "gate." Also, the storage capacitor "cap" may be formed of the drain region of the first TFT 20 and the gate electrode 31 of the second TFT 30. In this exemplary embodiment, TFTs (the first TFT 20 and the second TFT 30) are utilized as elements to control the luminescence of the respective pixels. However, the present invention is not limited thereto, and other control elements may be utilized. In addition, in this exemplary embodiment, the substrate 1 is composed of alkali glass.

Reference numeral 2 indicates an electrode to inject (supplying) holes or electrons (electric charges) into the EL layer 5. The electrode 2 is made of, for example, aluminum (Al), magnesium (Mg), and the like. However, the material is not limited thereto, and, for example, transparent ITO (indium tin oxide), which is an indium oxide film doped with tin oxide as impurity, may be used. In addition, instead of ITO, for example, IZO (indium zinc oxide), GZO (gallium zinc oxide), and ICO (InCeO; indium cerium oxide) may be utilized. Further, in this exemplary embodiment, the electrode 2 is used as an anode, while a conductive film 6, which will be described later, is used as a cathode.

Reference numeral 3 indicates a first low reflection layer. In this exemplary embodiment, pure titanium (Ti) is used as a material of the first low reflection layer 3. However, titanium nitride (TiN) and an alloy of titanium and tungsten (TiW) may be used. Furthermore, a layer of titanium oxide (TiO$_x$, Ti$_2$O$_3$, and Ti$_2$O$_5$) may be provided between the first low reflection layer and the second low reflection layer. The reason is because a local color of TiO$_x$ can reduce reflectance within a specific range. In this exemplary embodiment, as the second low reflection layer 4, ITO (or, IZO, GZO, and ICO) is utilized. In this exemplary embodiment, the first low reflection layer 3 and the second low reflection layer 4 also serve as an electrode of a light-emitting element. Further, the first low reflection layer 3 made of Ti may be used as the electrode 2.

Reference numeral 5 indicates an EL layer constituting the organic EL element (light-emitting element). In this exemplary embodiment, the EL layer 5 includes the hole injecting (transporting) layer 5A composed of, for example, thiophene-based conductive polymer, and a light-emitting layer 5B of light-emitting polymer (LEP). Alternatively, the EL layer 5 may have a structure in which the hole (electron) injecting layer is separated from a hole transporting layer, a three-layered structure of an electron injecting layer, a hole injecting layer, and a light-emitting layer, and a structure in which EL layers 5 different in structure are deposited. Furthermore, the second low reflection layer 4 composed of ITO, etc., may also function as the hole injecting layer, and the thiophene-based conductive polymer may function the hole transport layer. Reference numeral 6 indicates a conductive film, as the other electrode, to inject (supplying) holes or electrons into the EL layer 5. In this exemplary embodiment, the conductive film 6 may be composed of ITO (or IZO, GZO, and ICO), which is transparent in a visible ray range, similarly to the second low reflection layer 4. In addition, since ITO has a relatively high value of work function, in this case, an interface layer of the electron injecting layer of the EL layer 5 is added with, for example, BCP (biphasic calcium phosphate) and cesium (Cs) or is deposited with magnesium (Mg) and silver (Ag) to easily inject electrons. Further, the light-emitting control (control to supply electric charges) for the EL layer 5 of the respective pixels of the display panel is achieved by TFTs (first TFT 20 and second TFT 30) provided to the respective pixels via the electrode 2 corresponding to the EL layer 5 of the respective pixels. Therefore, it is not necessary to separately provide the conductive film 6 on the EL layer 5 of each pixel. Also, since electrons are easily injected into ICO from the viewpoint of the work function, and ICO has a lower sheet resistance than ITO, it is possible to supply electric charge to the entire display panel at a low voltage.

Reference numeral 7 indicates a bank (partition) to store a solution at a region forming the EL layer 5 in a case where the EL layer 5 of a polymer organic compound is formed by a liquid drop discharging method used for, for example, an inkjet printer. The bank 7 is composed of a photosensitive organic material, such as polyimide, acryl and the like, which is patterned using a photolithography method. Reference numeral 8 indicates a sealing film that is a sealing member. The sealing film 8 is made of, for example, silicon nitride (SiN), ITO and the like. If the organic EL element is exposed to moisture, oxygen and so forth, luminescent lifetime is shortened. Thus, the sealing film 8 is provided to reduce or prevent moisture, oxygen, etc., from permeating to the EL layer 5.

In the display panel of the present exemplary embodiment, a dual low reflection layer including the first low reflection layer 3 and the second low reflection layer 4 are provided in the vicinity of the anode that is a layer positioned lower than the EL layer 5 to reduce the reflection by the interaction of the respective layers and their interfaces. As such, a display panel with a simple structure and capable of suppressing the reflection of light incident from the exterior and of enhancing visibility outdoors can be obtained.

Next, an exemplary method of manufacturing the display panel according to this exemplary embodiment will be described. First, a semiconductor film made of amorphous silicon having a thickness of about 30 to 70 nm is formed on the substrate 1, for example, by a plasma CVD method. Then, the semiconductor film of the amorphous silicon film is changed into a polycrystal silicon film by performing a crystallizing process, such as a solid phase epitaxy and a laser annealing. Next, the semiconductor film is patterned to form an isolated film, and a gate insulating film 37 composed of a silicon oxide film or a silicon nitride film having a thickness of about 60 to 150 nm is formed on a surface of the semiconductor film.

Next, the conductive film made of, for example, titanium (Ti) and tungsten (W) is formed by a sputtering method and is then patterned to form gate electrodes 21 and 31 and the extended portion 36 of the gate electrode 31. Further, the scanning line "gate" is formed.

In this state, phosphorus ions of high concentration are doped, and the source and drain region is self-aligned with respect to the gate electrode. Next, after the interlayer insulating film 51 is formed, the respective through-holes are formed. Then, the data line "sig," the drain electrode 22, the common feeding line "com," the extended portion 39 of the common feeding line "com," and the electrode 2 (a portion herein) are formed. As a result, the first TFT 20, the second TFT 30, and the storage capacitor "cap" are formed. Although it is not shown herein, a driving circuit and other circuits may be simultaneously formed on portions other than the display portion.

Next, in order to reduce the effect due to a step generated by the formation of the control element, the planarizing insulating film 52 is formed before the first low reflection layer 3 is formed. The planarizing insulating film 52 is formed by applying, for example, polyimide or acryl using a spin coating method. A through-hole is formed at a portion corresponding to the connecting portion between the electrode 2 of the planarizing interlayer insulating film 52 and the second TFT 30. Next, after a conductive layer, which is the electrode 2, is deposited on the entire surface and is patterned, the first low reflection layer 3 is connected to the source and drain region of the second TFT 30. In addition, although the planarizing insulating film 52 is formed by the spin coating method in this exemplary embodiment, a method may be used in which, after a silicon oxide film or a silicon nitride film is formed by a CVD method, acryl, resist and the like are deposited by a spin coating method, and an etchback is performed thereon to flatten the surface.

Figure 3:
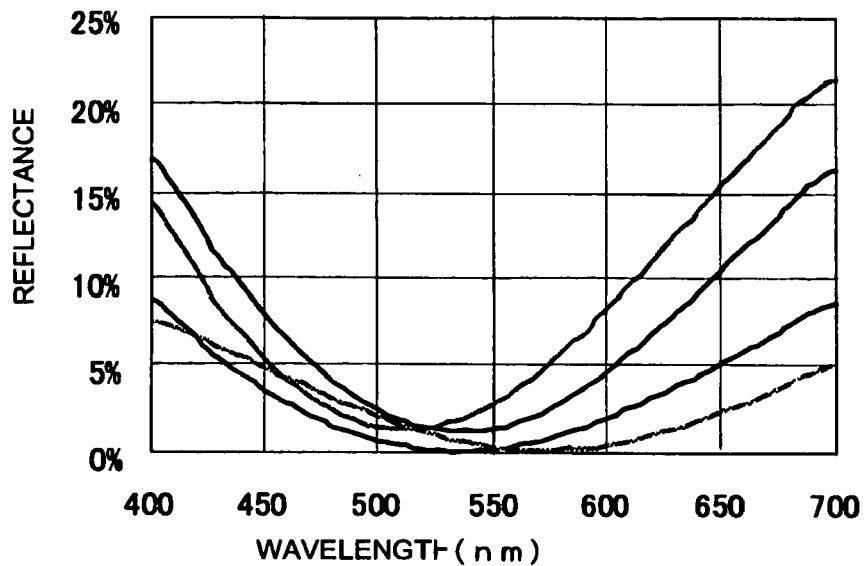
FIG. 3 is a graph depicting the relationship among a film thickness of Ti, which is a first low reflection layer 3, pressure in sputtering, and reflectance.
Figure 4:
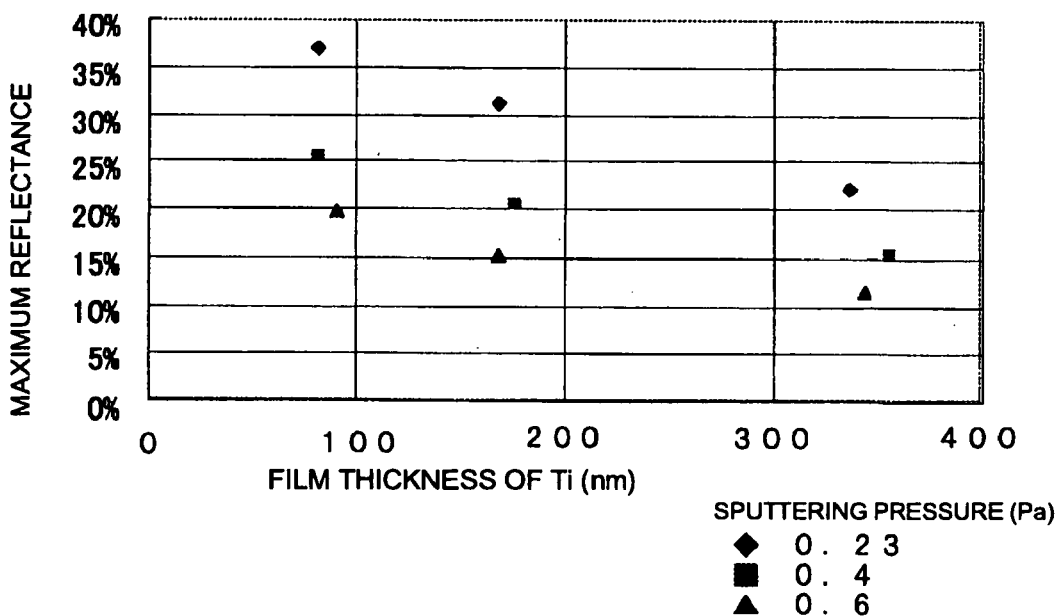
FIG. 4 is a graph depicting the relationship among a film thickness of Ti, which is the first low reflection layer 3, pressure in sputtering, and maximum reflectance.

FIG. 3 is a graph depicting the relationship among the thickness of titanium, which is used for the first low reflection layer 3, pressure at the time of sputtering, and reflectance. FIG. 3 depicts reflectance at an incident and emitting angle of 20°. Also, FIG. 4 is a graph depicting the relationship among the film thickness of Ti, which is used for the first low reflection layer 3, pressure at the time of sputtering, and maximum reflectance. In the present exemplary embodiment, the term "maximum reflectance" refers to the maximum value of the reflectance in a visible ray range (400 nm to 700 nm). In general, it may be considered that, if the maximum reflectance is low, reflectance is low over the whole visible ray range. As can be seen from FIGS. 3 and 4, the reflectance also depends upon the thickness of Ti (first low reflection layer 3) and pressure at the time of sputtering.

After the control element and the electrode 2 are formed on the substrate 1, a thin Ti layer, which is the first low reflection layer 3, is deposited by a sputtering method using a DC magnetron. In this exemplary embodiment, for example, the deposition is performed in an argon atmosphere under the conditions where the pressure is 0.3 Pa and electric power is 500 W. Although the sputtering method using the DC magnetron is utilized in this exemplary embodiment, the deposition method is not limited to the sputtering method, and an ion beam deposition method may be utilized. Herein, the first low reflection layer 3 is deposited to have a thickness of 30 nm to 400 nm. If the film thickness is 30 nm or less, reflectance is high. If the film thickness is 400 nm or more, internal stress is easily generated. As a result, there are possibilities that the substrate bends, the film peels off, and the breakdown of elements occurs. Further, it is difficult to process the substrate.

Figure 5:
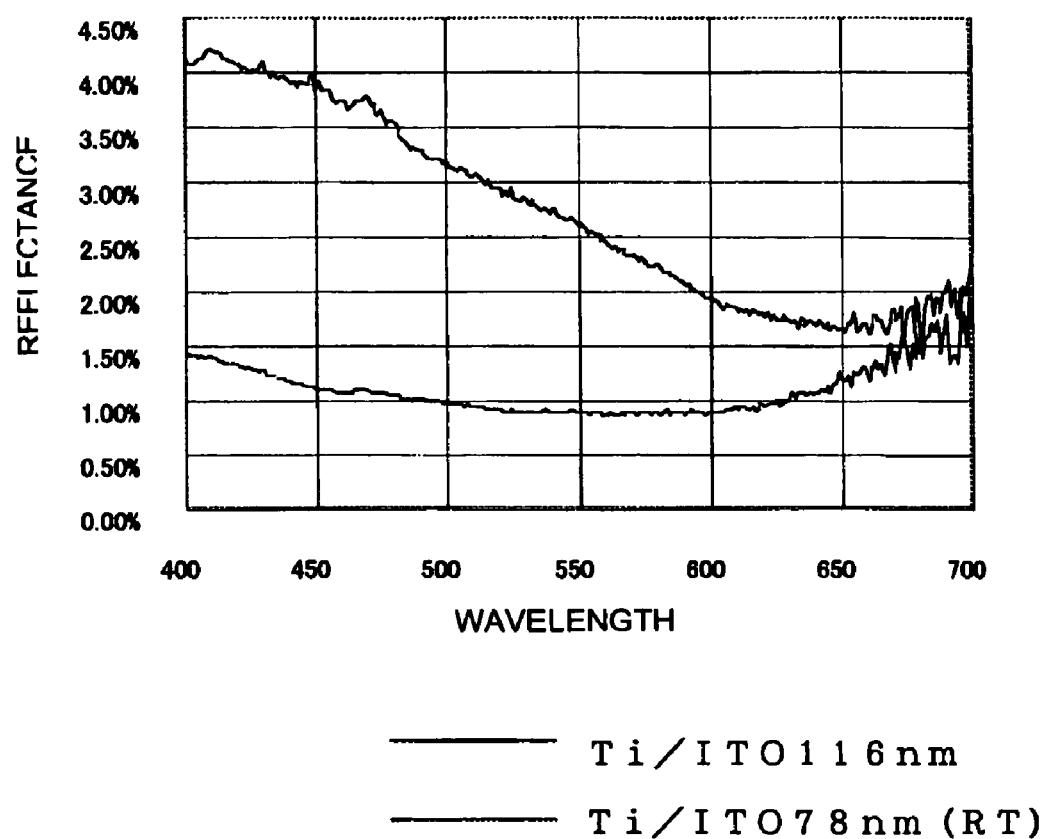
FIG. 5 is a graph depicting the relationship between the layer thickness of a second low reflection layer 4 and reflectance.
Figure 6A:
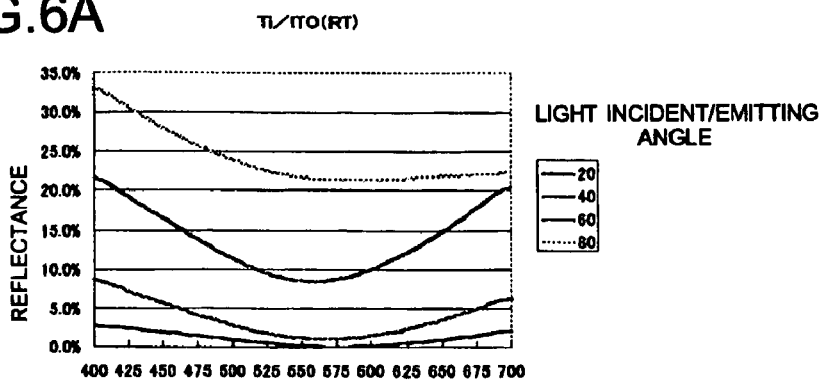
FIGS. 6(A)–6(C) are graphs depicting the relationship between reflectance and a light incident and emitting angle for every wavelength when the first low reflection layer 3 and the second low reflection layer 4 are deposited.
Figure 6B:
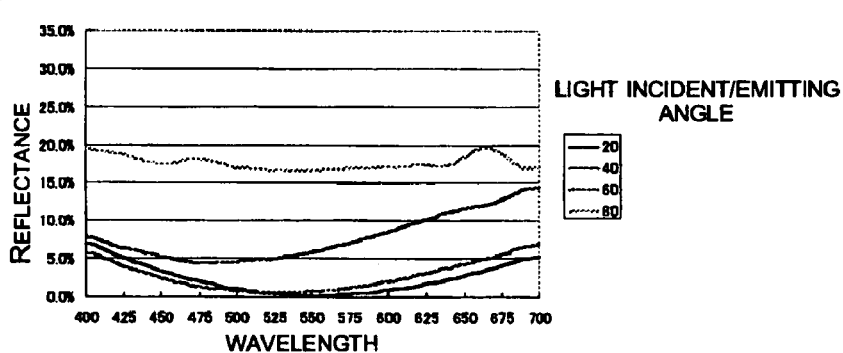
Figure 6C:
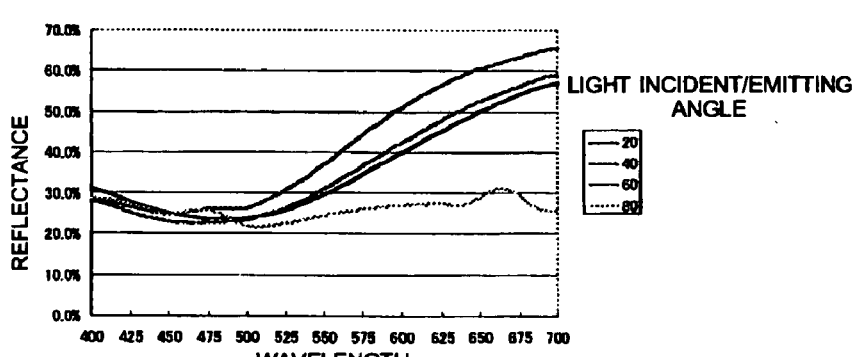
Figure 6D:
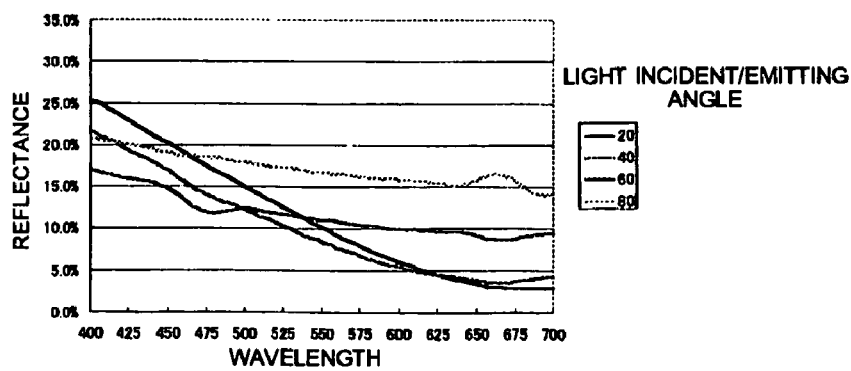

FIG. 5 is a graph depicting the relationship between the layer thickness of the second low reflection layer 4 and reflectance. FIG. 5 depicts two cases: the layer thickness of the second low reflection layer 4 is 116 nm; and the layer thickness of the second low reflection layer 4 is 78 nm. A thin film of ITO, which is the second low reflection layer 4, is deposited by the sputtering method using the DC magnetron, similarly to the first low reflection layer 3. In this exemplary embodiment, the deposition is performed under the conditions where the sputtering pressure is 0.3 Pa and electric power is 100 W. Further, the sputtering is performed under the conditions where a flow rate of argon gas to oxygen gas is 100:1 and a target of 4 inches is used. Herein, the wavelength dependency of the reflectance varies according to a variation in layer thickness as shown in FIG. 5. If the layer thickness of the second low reflection layer 4 is 60 nm to 100 nm, low reflectance is obtained over all wavelength ranges. In particular, if the layer thickness is 80 nm or less, the reflectance of light within the range of 450 nm to 500 nm, which is greatly affected by the light incident from the exterior, is reduced.

In this exemplary embodiment, the second low reflection layer 4 is crystallized at a high temperature by the sputtering method to have an uneven surface. The surface of the second low reflection layer 4 is deposited, for example, such that the arithmetic mean roughness Ra measured by a stylus-type step-difference measuring apparatus is 4 nm to 11 nm. Further, the substrate 1 and the second low reflection layer 4 are crystallized such that their arithmetic mean roughness Ra is 10 nm to 100 nm. As such, it is possible to reduce the reflectance much more. In order for the first low reflection layer 3 and the second low reflection layer 4 to be left at the desired portions, a photosensitive resin is applied and is then patterned by the photolithography method. The second low reflection layer 4 (ITO) is etched by aqua regia using the photosensitive resin as a mask. Also, the first low reflection layer 3 (Ti) is etched by a buffer hydrofluoric acid (BHF) solution in which the ratio of hydrofluoric acid to fluoric ammonium is 1:6.

Herein, the first low reflection layer 3 and the second low reflection layer 4 are left at a region wider than a region on which the respective EL layers 5 are deposited. Specifically, the low reflection layers are extended to the lower region on which the bank 7 is formed, and the spacing (gap) between the first and second low reflection layers 3 and 4 is formed as narrow as possible. In this way, it can suppress a reduction in visibility due to the reflection of light from a layer closer to the substrate than the first low reflection layer and a rear side of the substrate.

In the related art, when the patterning is performed by the photolithography method, the minimum value of the gap is almost equal to the thickness of the layer to be processed. For example, if the total thickness of the first low reflection layer 3 and the second low reflection layer 4 is 0.1 μm, the minimum value of the gap is almost 0.1 μm. Herein, the first low reflection layer 3 and the second low reflection layer 4 may be formed in only desired portions by, for example, a mask deposition method. A mask deposition is a method of forming a pattern by performing the vacuum deposition in a state where a mask, which is made of, for example, stainless steel having a thickness of 40 μm to 100 μm and in which openings are formed at the desired portions, adheres closely to the substrate. Further, chromium (Cr; 4.5 eV of work function) may be deposited on the second low reflection layer 4.

Next, a film composed of an inorganic material is formed on a surface of the planarizing insulating film 52 by a PECVD method, etc., and is patterned to leave a region in which the bank 7 is formed and a circumferential region of the second low reflection layer 4, thereby forming an insulating passivation film 61. The insulating passivation film 61 is formed to have a thickness of 0.2 μm to 1.0 μm, for example, if the light-emitting layer 5 is formed to have a thickness of 0.05 μm to 0.2 μm.

Then, the bank 7 of an organic material is formed along the scanning line "gate" and the data line "sig." When the deposition is performed by a liquid drop discharging method, the bank 7 functions to reduce or prevent a liquid material containing an organic compound from overflowing to adjacent regions. Accordingly, for example, if the light-emitting layer 5 is formed of a thickness of 0.05 μm to 0.2 μm, the bank is formed of a height of 1 μm to 2 μm. The formation of the bank may be performed by, for example, a photolithography method, a printing method, and other methods.

A solution containing a polymer organic compound is discharged in the region defined by the bank 7 using the liquid drop discharging (inkjet) method to form the EL layer 5 (the hole injecting and transporting layer 5A and the light-emitting layer 5B). In the EL layer 5, the discharging and drying of a liquid material containing an organic compound are repeatedly performed on every layer. As a specific example of the light-emitting layer 5B, a material for a red light-emitting layer includes a solution, in which an inky PPV precursor is doped with pigment, such as rhodamine, beryllium, and the like, or an inky PPV precursor (MHE-PPV). A material for a blue light-emitting layer includes an inky solution in which a polyfluorene derivative is dissolved by an aromatic solvent, such as xylene. Next, in the case of the PPV precursor solution (PPV precursor solution is diluted by DMF and is converted into ink), a solvent is removed from the PPV precursor under reduced pressure, and the solution is conjugated and settled by heat treatment at 150° C. Alternatively, in the case of a material commonly usable for the respective pixels, each layer of the EL layer 5 may be deposited by a spin coating method, a deep method, and the like. Also, in a case where organic EL elements of the EL layer 5 are composed of a low molecular organic compound, the region on which the EL layer 5 is deposited remains, and other regions are masked. Then, the region may be deposited with organic compounds for the respective layers. Alternatively, in order to enhance the efficiency of electron injection from the conductive film 6, an electron injecting layer composed of, for example, magnesium/silver (Mg/Ag) may be deposited by a deposition method. If the EL layer 5 is formed, the conductive film 6 of ITO is deposited on the entire surface of at least the display portion by the deposition method.

Herein, when the first low reflection layer 3 is made of titanium (titanium oxide), the hole injecting and transporting layer 5A, the light-emitting layer 5B (LEP), and the conductive film 6 (ITO) are preferably formed of the thickness as shown in Table 1 in order to reduce reflectance.

TABLE 1

|  | Conductive film 6 (ITO) | Light-emitting layer 5B (LEP) | Hole injecting and transporting layer 5A (PEDOT) | Second reflection layer 4 (ITO) |
| --- | --- | --- | --- | --- |
| (1) | 145 ± 10 | 80 ± 10 | 90 ± 10 | 72 ± 10 |
| (2) | 145 ± 10 | 160 ± 10 | 90 ± 10 | 72 ± 10 |
| (3) | 145 ± 10 | 80 ± 10 | 180 ± 10 | 72 ± 10 |
| (4) | 145 ± 10 | 160 ± 10 | 180 ± 10 | 72 ± 10 |

(unit: nm)

On the conductive film 6, a thin sealing film 8 composed of a transparent resin is formed on the entire display panel. Therefore, the EL layer 5 (an organic EL element) does not vary in property when it is exposed to moisture and air, and thus its lifespan is lengthened. The sealing film 8 is obtained by depositing, for example, SiON (silicon-oxynitride) or MgO (magnesium oxide) to a film thickness capable of transmitting a visible ray using a deposition method and by adhering a polymer film, such as polyvinyl fluoride thereto by adhesive or by melting and attaching it thereto by heat. Also, the display portion may be covered with a transparent substrate, which will be described later.

FIG. 6 is a graph depicting the relationship between reflectance and a light incident/emitting angle for every wavelength when the first low reflection layer 3 and the second low reflection layer 4 are deposited. In FIG. 6(A), titanium to form the first low reflection layer 3 is sputtered, and ITO to form the second low reflection layer 4 is sputtered of a thickness of 78 nm at room temperature (RT). In FIG. 6(B), after the sputtering method is performed under the same conditions as the above, the layers are treated in an atmosphere at a temperature of 280° C. for one hour. In FIG. 6(C), only pure titanium is sputtered to form the first low reflection layer 3. And, in FIG. 6(D), three layers of Al, ITO, and Al are formed. In FIG. 6(D), the conditions, such as the layer thickness of ITO, are the same as those shown in FIG. 6(A). Therefore, there is a possibility that the maximum reflectance will not be obtained under the conditions shown in FIG. 6(D), but it is shown for reference.

Figure 7A:
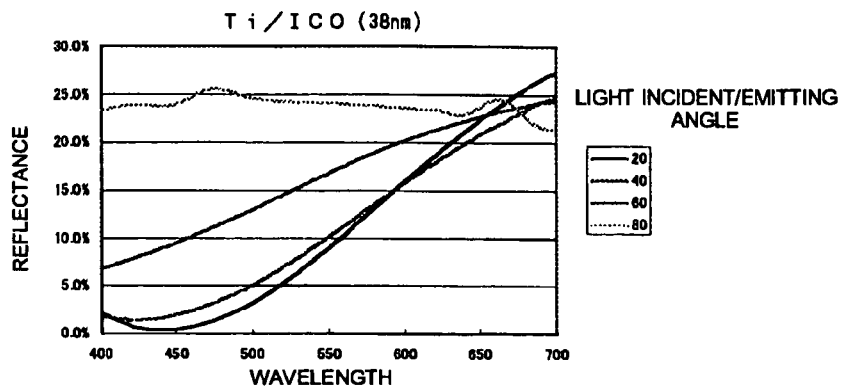
FIGS. 7(a)–7B) are graphs depicting the relationship between reflectance and a light incident and emitting angle for every wavelength when the first low reflection layer 3 of Ti and the second low reflection layer 4 of ICO are deposited.
Figure 7B:
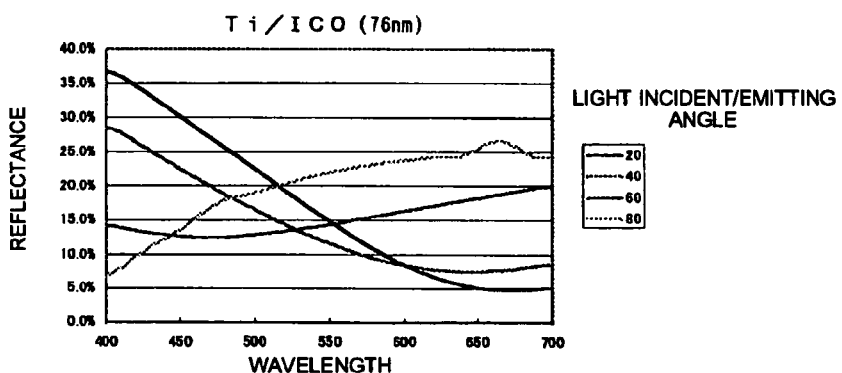

FIG. 7 is a graph depicting the relationship between reflectance and a light incident/emitting angle for every wavelength when the first low reflection layer 3 is formed of Ti and the second low reflection layer 4 is formed of ICO. In FIG. 7(A), ICO to form the second low reflection layer 4 is formed of a thickness of 38 nm, and in FIG. 7(B), ICO for the second low reflection layer 4 is formed of a thickness of 76 nm. ICO is deposited by the sputtering method using an indium cerium oxide containing 20 at % (the ratio of the number of atoms (molecules)) of a cerium oxide as a target. Although a layer capable of reducing reflectance and a light incident/emitting angle vary in accordance with thickness, it will be understood that all of the cases reduces the reflectance of light with a wavelength of approximately 500 nm in which visibility is high. Further, according to FIGS. 6 and 7, it is understood that reflectance is low when the first low reflection layer 3 is made of Ti.

According to the first exemplary embodiment described above, the reflectance can be effectively reduced by the interaction of the first low reflection layer 3, the second low reflection layer 4, the EL layer 5, and their interfaces. Therefore, the visibility of images displayed on the display panel can be enhanced outdoors. In particular, when organic EL elements, which are self-luminescent elements, are used for a display panel (display device), such an effect is obtained. Further, Ti, TiN or TiW is used for the first low reflection layer 3, and ITO is used for the second low reflection layer 4, thereby effectively suppressing reflection. In addition, a basic low reflection structure is composed of two layers of the first low reflection layer 3 and the second low reflection layer 4, thereby easily manufacturing the display panel.

Second Exemplary Embodiment

Figure 8:
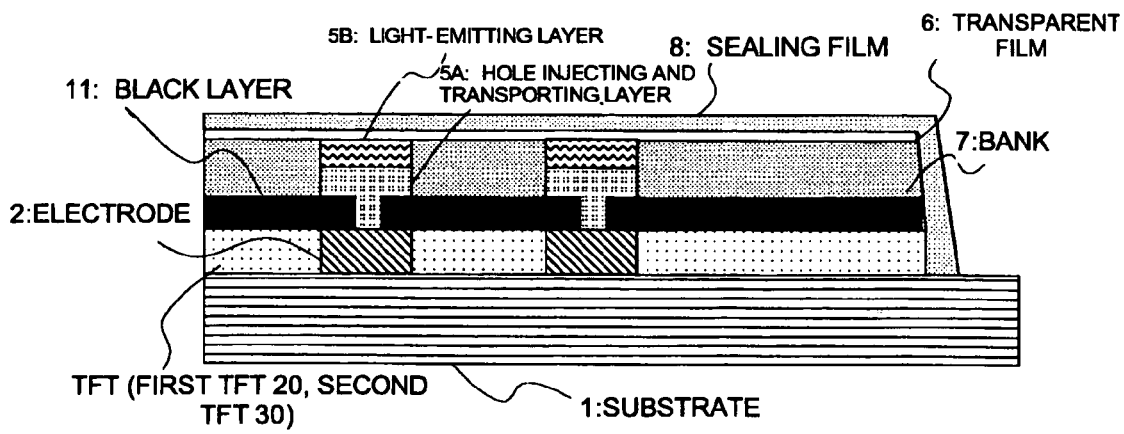
FIG. 8 is a cross-sectional view of a part of a display panel according to a second exemplary embodiment of the present invention.

FIG. 8 is a cross-sectional view showing a part of the display panel according to a second exemplary embodiment of the present invention. Elements indicated by the same reference numerals as those in FIG. 1 correspond to those described in the first exemplary embodiment, and thus the description thereof will be omitted herein. Although FIG. 8 shows only a portion that is required for the description of this exemplary embodiment, the structure of this exemplary embodiment is similar to that of the first exemplary embodiment. Reference numeral 11 indicates a black layer (combining the aforementioned planarizing insulating film 52) into which an insulating photosensitive resin containing a black pigment is solidified. Further, reference numeral 5A indicates a hole injecting and transporting layer, and reference numeral 5B indicates a light-emitting layer, which are parts of the EL layer 5. In addition, ITO used for the second low reflection layer 4 may be used for the hole injecting and transporting layer 5A.

In this exemplary embodiment, the black layer 11 absorbs the light incident from the exterior to suppress the reflection of light and thus reduce reflectance. In this exemplary embodiment, since the black layer 11 is deposited by a spin coating method, the influence of the step difference due to a driving element, wiring lines, etc., upon the reflectance can be reduced.

Figure 9:
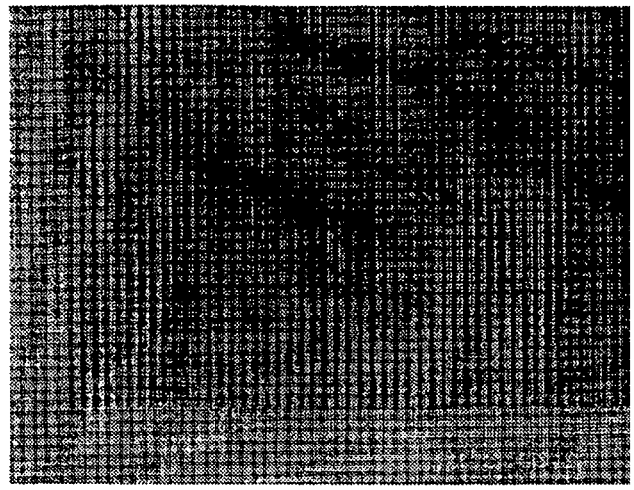
FIG. 9 is a view of a patterned black layer 11.

Next, an exemplary method of manufacturing the display panel according to the present exemplary embodiment will be described. A process of forming the TFT 30 and the electrode 2 on the substrate 1 is substantially equal to that of the first exemplary embodiment, and the description thereof will be omitted herein. The substrate is rotated at a predetermined speed of revolution, and an insulating photosensitive resin containing a black pigment is dropped on the substrate. In addition, the substrate is rotated at a given speed of revolution during a given period of time to perform a spin coating. For example, COLOR MOSAIC CK CK-A029, which is commercially available from FUJIFILM Arch Co., Ltd., is used as the photosensitive resin. This photosensitive resin has an OD value of 3 (value indicated by -log (reflectance or transmittance)) in the case of a thickness of 1 μm. The number of revolutions, time, and the amount of resin are adjusted such that the layer thickness is about 1 μm (for example, the number of revolutions after dropping is 1000 rpm, time is 30 seconds, and the amount of resin dropped on the substrate of 4 inches is 2 ml). After that, a prebake is performed at 110° C. for 120 seconds. After the resin is exposed (for example, radiate ultraviolet rays of 400 mJ/cm$^2$) to form a pattern of the electrode 2 (hole injecting layer 5A), the substrate is dipped in a 20% solution (26° C.) of a developer CD, which is commercially available from FUJIFILM Arch Co., Ltd., for 45 seconds and is then developed, washed in water, and dried (220° C., 60 minutes). FIG. 9 is a photomicrograph of the black layer 11 patterned on the substrate 1, which is magnified 100 times. Although the black layer has grooves, the black layer is preferably patterned such that through-holes are formed at the positions corresponding to the pixels in order to obtain the maximum effect. The connection between the hole injecting and transporting layer 5A and the electrode 2 is obtained by performing such patterning.

In the case of forming the EL layer 5 using a polymer organic compound, after the bank 7 is formed similarly to the first exemplary embodiment, a liquid material containing the polymer organic compound, which is used for forming the hole injecting and transporting layer 5A, is discharged by a liquid drop discharging method and is then solidified to form the hole injecting and transporting layer 5A. Further, a liquid material containing the polymer organic compound, which is used to form the light-emitting layer 5B, is discharged by the liquid drop discharging method and is then solidified to form the EL layer 5.

Figure 10:
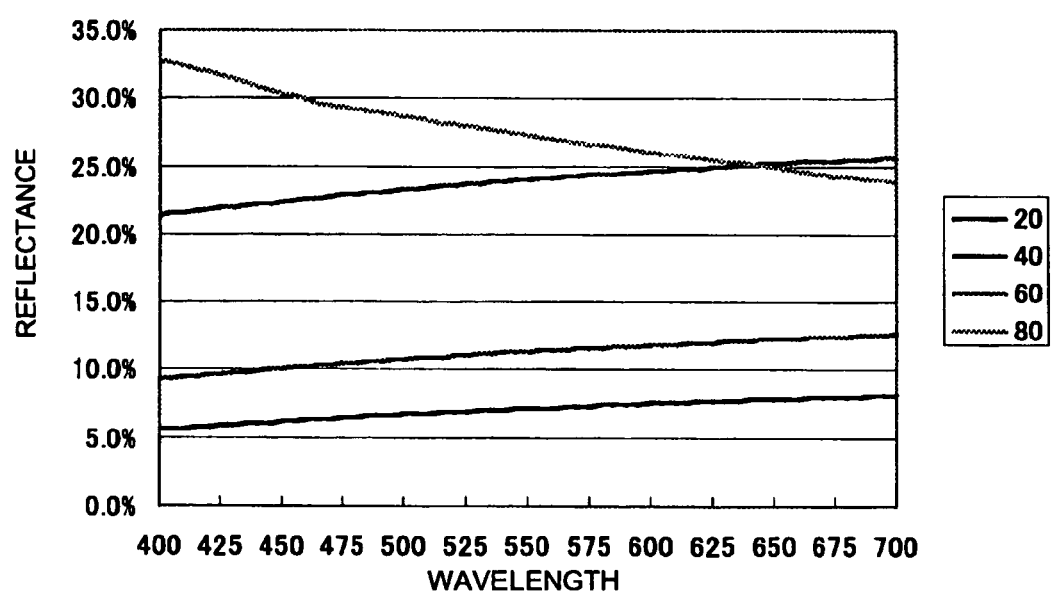
FIG. 10 is a graph depicting the relationship between reflectance and a light incident and emitting angle of the black layer 11.

FIG. 10 is a graph depicting the relationship between reflectance and a light incident/emitting angle of the black layer 11. After the EL layer 5 is formed, the conductive film 6 and the sealing film 8 is formed by the same method as that used in the first exemplary embodiment. The black layer 11 of the display panel formed by the above method has the wavelength dependency on reflectance in a visible ray range as shown in FIG. 10.

As described above, according to the second exemplary embodiment, the black layer 11 absorbs the light incident from the exterior to suppress the reflection of light and thus reduces reflectance. Further, since the black layer 11 is formed by a spin coating method, the influence of the step difference due to a driving element, wiring lines, etc., upon reflectance can be reduced, and the uniformity of the film thickness of the EL layer 5 can be enhanced, thereby enhancing the uniformity in the light-emitting surface.

Third Exemplary Embodiment

Figure 11:
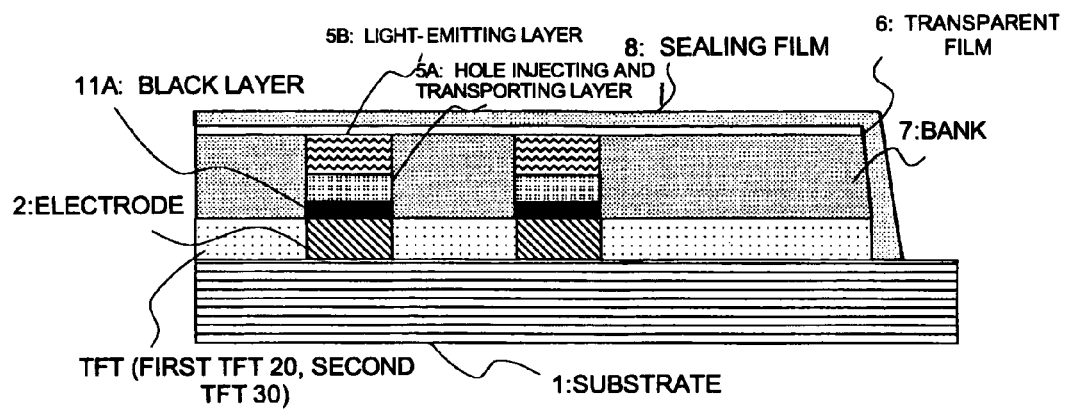
FIG. 11 is a cross-sectional view of a part of a display panel according to a third exemplary embodiment of the present invention.

FIG. 11 is a cross-sectional view showing a part of the display panel according to a third exemplary embodiment of the present invention. Elements indicated by the same reference numerals as those in FIG. 8 are the same or equivalent as those described in the first and second exemplary embodiments, and thus the description thereof will be omitted herein. Reference numeral 11A indicates a black layer formed of an allotrope of carbon having conductivity.

In the present exemplary embodiment, the black layer 11A absorbs the light incident from the exterior to decrease the reflecting light and thus reduces reflectance, as similar to the second exemplary embodiment. In this exemplary embodiment, the black layer 11A is formed of an allotrope of carbon. Since the black layer 11A is made of carbon having conductivity, it is not necessary to electrically connect the electrode 2 to the hole injecting and transporting layer 5A directly.

Next, an exemplary method of manufacturing the display panel according to the present exemplary embodiment will be described. A process of forming the TFT 30 and the electrode 2 on the substrate 1 is substantially equal to that of the first exemplary embodiment, and the description thereof will be omitted herein. The black layer 11A is formed of carbon. Herein, DLC (Diamond Like Carbon) is used to form the black layer 11A. DLC is the general term for a carbon thin film deposited by a vapor phase growth method using ions, and the carbon thin film has high hardness and the transparency of infrared rays similar to those of diamond. DLC is deposited by, for example, a sputtering method, CVD, etc. As such, a thinner layer may be formed and the influence on light-emitting elements may be reduced, compared with performing a spin coating method as in the second exemplary embodiment.

Figure 12:
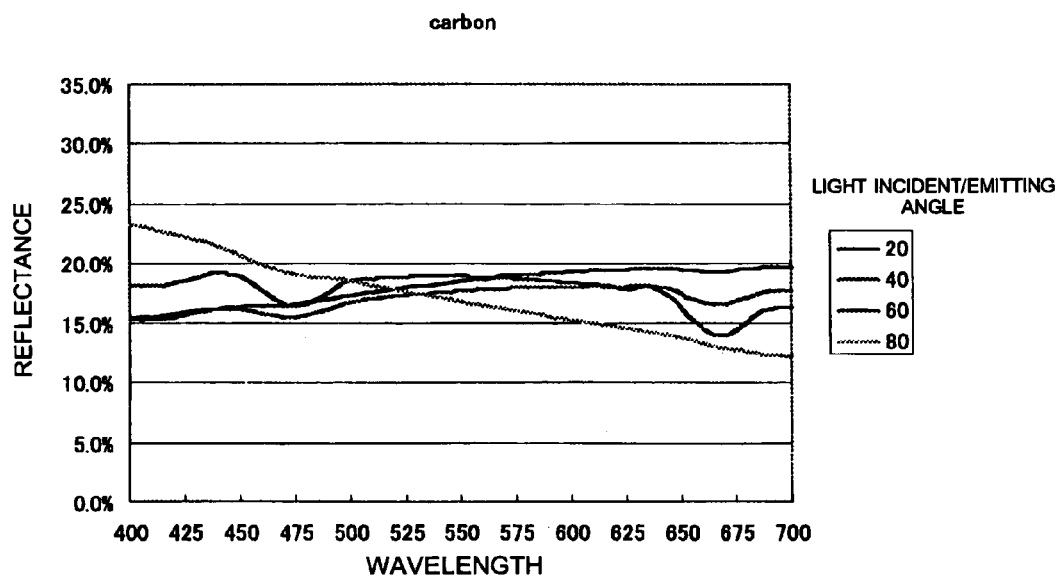
FIG. 12 is a graph depicting the relationship between reflectance and a light incident and emitting angle of a black layer 11A.

FIG. 12 is a graph depicting the relationship between reflectance and a light incident/emitting angle of the black layer 11A. A method of forming the bank 7, the EL layer 5, the conductive film 6, and the sealing film 8 is equal to that of the first and second exemplary embodiments, and thus the description thereof will be omitted. However, the black layer 11A may be deposited after the bank 7 is first formed.

In addition, the black layer 11A is formed of DLC, but may be formed of, for example, an allotrope of carbon, such as amorphous carbon, graphite, and the like. Graphite is deposited by a vacuum deposition method or a sputtering method. In the case of using the sputtering method, provided that carbon atom can be sputtered, it is preferable to utilize a target made of any allotrope.

According to the third exemplary embodiment, since the black layer 11A is formed of an allotrope of carbon having conductivity by the sputtering method or the vacuum deposition method, a thinner black layer is obtained, thereby reducing the influence of light-emitting elements upon their characteristics.

Fourth Exemplary Embodiment

According to the second and third exemplary embodiments, the light incident from the exterior is absorbed by the black layer 11 or 11A to suppress reflection. The absorbed light is converted into heat. Therefore, the temperature of the display panel increases, and the heat has an influence on the light-emitting lifespan of an organic compound forming the EL layer 5. In order to reduce or prevent the above problem, an element having a Peltier effect (hereinafter, "Peltier element") is provided. The Peltier effect refers to an endothermic and exothermic phenomenon by current. If DC current is applied to a junction portion of a p-type semiconductor and an n-type semiconductor, an endothermic/exothermic reaction is generated in the junction portion. The Peltier element cools down a device using such a reaction. Therefore, it is possible to precisely control the temperature by only controlling a driving current.

Figure 13:
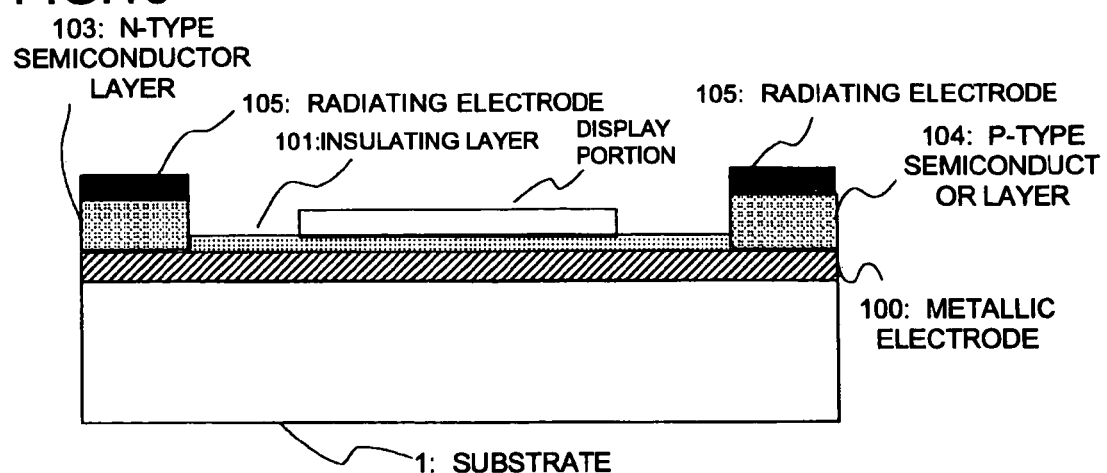
FIG. 13 is a view depicting a display panel provided with a Peltier element.

FIG. 13 shows a display panel provided with a Peltier element. The Peltier element includes a metallic electrode 100, an N-type semiconductor layer 103, a P-type semiconductor layer 104, and a radiating electrode 105. Next, an exemplary method of manufacturing the Peltier element will be described. First, for example, a silicon oxide film is deposited on a substrate 1 as a passivation film (not shown). And, metal for the metallic electrode 100 is deposited thereon, for example, with a thickness of 200 nm by a sputtering method. For example, chromium (Cr) is used as the material to form the metallic electrode 100. Then, the substrate is patterned by a photolithography method to form the metallic electrode 100 in a desired shape.

Further, a silicon oxide film for the insulating film 101 is deposited on the desired portions of the metallic electrode 100 by a CVD method, etc. Then, a driving element is formed thereon by the same method as in the first exemplary embodiment. It is preferable to manufacture the light-emitting device after manufacturing the Peltier element because of the influence on the light-emitting layer 5.

After the insulating film 101 is patterned by a photolithography method, the desired portions of the insulating film 101 are etched, and the N-type semiconductor layer 103 and the P-type semiconductor layer 104 are deposited. At this time, for example, BiTe (bismuth telluride) doped with selenium (Se) is used to form the N-type semiconductor layer 103. Further, BiTe doped with antimony (Sb) is used for forming the P-type semiconductor layer 104. The above materials are deposited with a thickness of 500 nm by, for example, the sputtering method, respectively. Then, after aluminum (Al) for forming the radiating electrode 105 is deposited with a thickness of 500 nm and is patterned by the photolithography method, the aluminum is etched such that the desired portions remain. After that, the substrate is maintained at 150° C. (firing temperature of BiTe) for 1 hour to form the N-type semiconductor layer 103, the P-type semiconductor layer 104, and the radiating electrode 105, thereby manufacturing a Peltier element. The N-type semiconductor layer 103 and the P-type semiconductor layer 104 may be formed by doping the semiconductor layer, which is an active region of the driving element, with a high concentration of N-type impurity and P-type impurity, respectively. Further, the radiating electrode 105 may be formed using the same layer as the wiring line layer of the driving element.

As described above, according to the fourth exemplary embodiment, since the heat converted from the light absorbed by the black layer 11 or 11A is radiated externally by the Peltier element, the lifespan of an organic EL element, which is easily affected by the temperature, can be lengthened. In addition, the Peltier element is formed together with the TFT 30, thereby effectively arranging the circuit (element).

Fifth Exemplary Embodiment

Although not described specifically in the above second and third exemplary embodiments, after the second low reflection layer 4 described in the first exemplary embodiment is deposited on the black layer 11 or 11A, the EL layer 5 may be deposited thereon.

Sixth Exemplary Embodiment

Figure 14A:
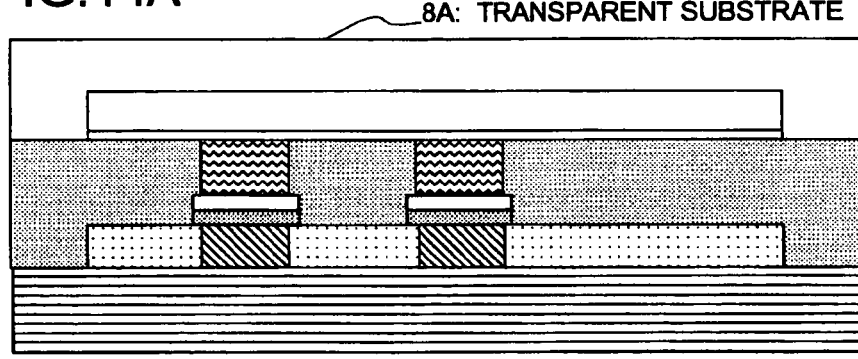
FIGS. 14(A) and 14(B) are views depicting a sealing method according to a sixth embodiment of the present invention.
Figure 14B:
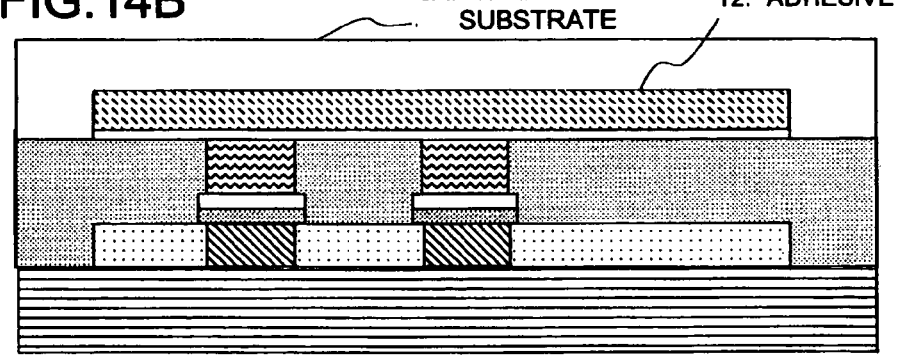

FIG. 14 shows a sealing method according to a sixth embodiment of the present invention. In this exemplary embodiment, a sealing method used instead of the sealing film 8 according to the first exemplary embodiment will now be described. In FIG. 14(A), for example, a frame portion of the periphery (if necessary, including a display control circuit) of the display portion adheres to a transparent substrate 8A, such as a glass substrate, having a concave portion using an adhesive, etc., and is then sealed. At that time, the sealing process is performed under vacuum to reduce or prevent moisture from coming thereinto. Further, a desiccant to absorb the moisture permeated through the adhesive may be filled therein. When the second low reflection layer 4 is deposited, an ITO layer may be deposited on the frame portion such that the adhesive is easily absorbed thereto due to the roughness effect, thereby increasing its adhesion. In this way, the permeation of moisture or oxygen can be reduced or prevented. In FIG. 14(B), a space between the transparent substrate 8A and the conductive film 6 is filled with an adhesive 12, and then they adhere to each other. The adhesive 12 reduces or prevents moisture from permeating into the organic EL element.

As described above, according to the sixth exemplary embodiment, instead of the sealing film 8, the transparent substrate 8A having the concave portion is adhered and sealed, or an adhesive is filled in the concave portion of the transparent substrate 8A. Therefore, it is possible to reduce or prevent moisture from permeating into the organic EL element 5, thereby prolonging the light-emitting lifespan of the organic EL layer 5.

Seventh Exemplary Embodiment

In the aforementioned exemplary embodiments, an active matrix display panel is described. However, the present invention is not limited thereto, and may be applied to a passive matrix display panel.

Eighth Exemplary Embodiment

In the aforementioned exemplary embodiments, a display panel utilizing organic EL elements is described. However, the present invention is not limited thereto, but may be applied to other display panels utilizing flat display panels, such as a display panel using inorganic EL elements, LCD, and PDP. Furthermore, in the aforementioned exemplary embodiments, a display panel of the so-called top emission structure in which a light-emitting light of the light-emitting layer 5B is emitted from the light-emitting element forming surface on the substrate 1 is described. However, the present invention is not limited thereto, but may be applied to the so-called bottom emission structure in which a light-emitting light of the light-emitting layer 5B is emitted from a surface opposite to the light-emitting element forming surface on the substrate 1. Further, when the light-emitting surface is covered with glass, which has the reflectance of 4%, an antireflection (AR) process may be performed thereon, that is, a multi-layered antireflection film obtained by depositing a coating material may be formed on the glass, or an antireflection film may adhere to the glass.

Ninth Exemplary Embodiment

Figure 15A:
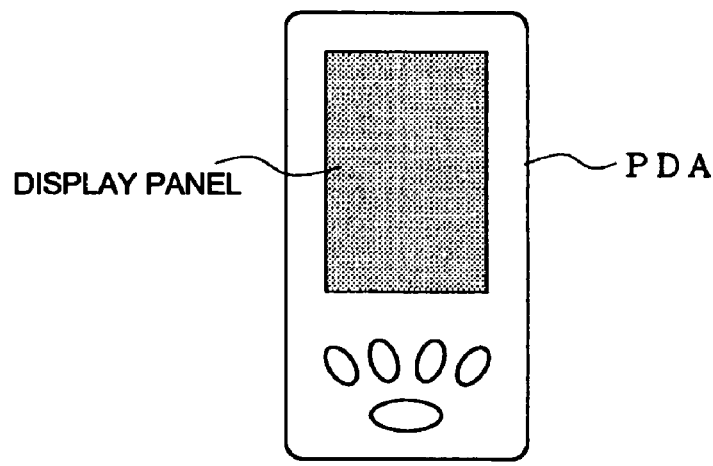
FIGS. 15(A)–15(C) are views depicting an electronic apparatus according to a ninth exemplary embodiment of the present invention.
Figure 15B:
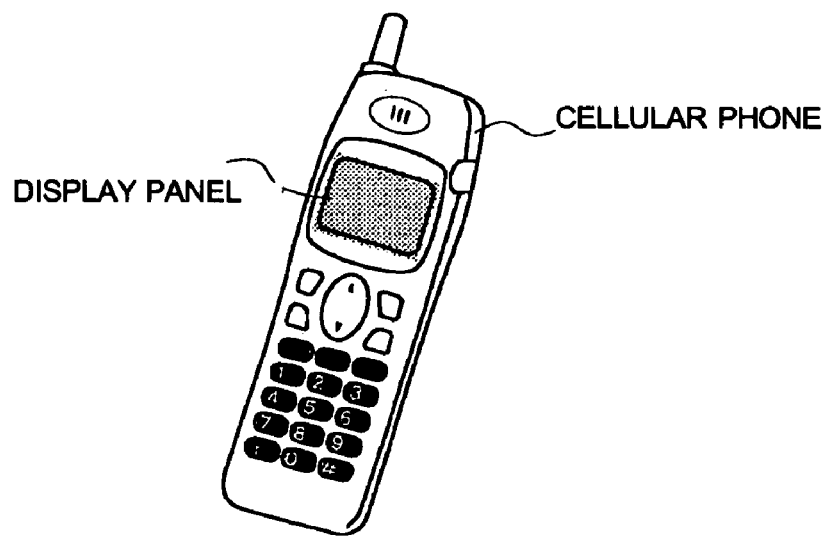
Figure 15C:
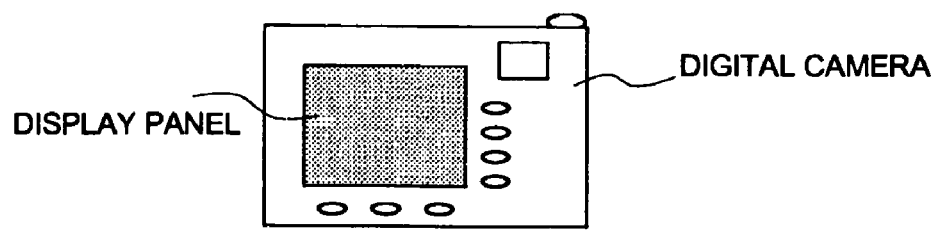

FIG. 15 is a view depicting electronic apparatuses according to a ninth exemplary embodiment of the present invention. FIG. 15(A) shows a PDA (personal digital assistant), FIG. 15(B) shows a cellular phone, and FIG. 15(C) shows a digital camera. Although it is not shown in the present exemplary embodiment, a display panel of the present invention may be applied to electronic apparatuses having a displaying function and utilizing a display panel, such as personal computers and electronic game consoles. In particular, when a display panel of the present invention is applied to electronic apparatuses used outdoors, it can have an enhanced effect.

The invention claimed is:

1. A display panel, comprising:
   a first low reflection layer that is made of titanium and that is disposed on a substrate;
   a second low reflection layer that is made of indium tin oxide and that is disposed above the first low reflection layer;
   a titanium oxide layer disposed between the first low reflection layer and the second low reflection layer; and
   a light-emitting layer that is disposed on the second low reflection layer.

2. The display panel according to claim 1, further comprising a conductive film made of Indium Cerium Oxide disposed above the light-emitting layer.

3. The display panel according to claim 1, the second low reflection layer being deposited with a thickness of 60 nm to 100 nm.

4. A display panel according to claim 1, the first low reflection layer being made of titanium nitride instead of titanium.

5. The display panel according to claim 1, the first low reflection layer being deposited with a thickness of 30 nm to 400 mm.

6. The display panel according to claim 1, further comprising:
   a hole injecting and transport layer disposed between the second low reflection layer and the light-emitting layer; and
   a conductive layer made of indium tin oxide on the light-emitting layer,
   wherein a thickness of the second low reflection layer is 62 nm to 82 mm, a thickness of the conductive layer is 135 nm to 155 mm, a thickness of the light-emitting layer is 70 nm to 90 nm or 150 mm to 170 mm, and a thickness of the hole injecting and transporting layer is 80 nm to 100 mm or 170 nm to 190 mm.

7. The display panel according to claim 1, wherein a chromium layer is further disposed on the second low reflection layer.

8. The display panel according to claim 1, further comprising:
   a plurality of control elements disposed between the substrate and the first low reflection layer; and
   a plurality of wiring lines disposed between the control elements and the first low reflection layer and electrically connecting the control elements,
   wherein in a step of forming the control elements and the wiring lines and a step of forming the first low reflection layer or the second low reflection layer, some of or all of the steps are commonly used.

9. An electronic apparatus, comprising:
   the display panel according to claim 1 to perform display.

10. The display panel according to claim 1, wherein the first low reflection layer is used as the wiring line electrically connecting the control element and the first low reflection layer.

11. A display panel, comprising:
    a first low reflection layer that is made of titanium and that is disposed on a substrate;
    a second low reflection layer that is disposed above the first low reflection layer;
    a titanium oxide layer disposed between the first low reflection layer and the second low reflection layer; and
    a light-emitting layer that is disposed on the second low reflection layer,
    the second low reflection layer being made of indium zinc oxide, gallium zinc oxide, or indium cerium oxide.

* * * * *